United States Patent [19]
Heuermann

[11] Patent Number: 6,078,184
[45] Date of Patent: Jun. 20, 2000

[54] MEASURING TIP UNIT

[75] Inventor: Holger Heuermann, Tittmoning, Germany

[73] Assignee: Rosenberger Hochfrequenztechnik GmbH & Co., Tittmoning, Germany

[21] Appl. No.: 08/948,805

[22] Filed: Oct. 10, 1997

[30] Foreign Application Priority Data

Oct. 10, 1996 [DE] Germany .......................... 196 41 880

[51] Int. Cl.$^7$ .................................................. G01R 1/073
[52] U.S. Cl. ............................................ 324/754; 324/762
[58] Field of Search .................................. 324/754, 762, 324/72.5, 759, 765

[56] References Cited

U.S. PATENT DOCUMENTS

| | | | |
|---|---|---|---|
| 4,593,243 | 6/1986 | Lao et al. ................................. | 324/754 |
| 4,849,689 | 7/1989 | Gleason et al. ......................... | 324/754 |
| 4,871,964 | 10/1989 | Boll et al. ............................... | 324/72.5 |
| 5,565,788 | 10/1996 | Burr et al. ............................... | 324/762 |

OTHER PUBLICATIONS

Sales brochure for GGB Industries Inc. for *Picoprobe*, before Jan. 1994.

O. Zinke•H. Brunswig, Hochfrequentztechnik 1, Springer 5$^{th}$ Ed. p. 157, before Sep. 1995.

Carlton et al, "Microwave Wafer Probing" *Microwave Journal*, Jan. 1985, pp. 121–129.

*Primary Examiner*—Ernest Karlsen
*Attorney, Agent, or Firm*—Hill & Simpson

[57] ABSTRACT

A measurement tip unit for contacting planar microwave circuits includes a substrate with a coplanar line in a housing in which a coaxial line terminal is constructed and from which at least two contact tips extend. One end of the coplanar line is connected with a coaxial line terminal and the other end is connected with the contact tips. The contact tips are constructed as thin needles made of spring steel material which are arranged along side one another.

16 Claims, 2 Drawing Sheets

MEASURING TIP UNIT

BACKGROUND OF THE INVENTION

The present invention is directed to a measuring tip unit for contacting planar microwave circuits.

Measurement tip units for microwave wafer measurement means or wafer probes, which units have a coaxial cable that leads to a measuring apparatus for example to a vectorial network analyzer in contact with a contact tip, are disclosed by U.S. Pat. No. 4,871,964, whose disclosure is incorporated by reference, and by the Sales Brochure for GGB Industries, Inc. for the "PicoProbe"® which is a high performance microwave probe. The inner conductor of the coaxial cable extends beyond the outer conductor and is pointed at the end and bent downward in the shape of a claw. A contact spring, also bent downward in a claw shape, is fastened to the outer conductor of the coaxial cable on at least one side. These known measurement tips wear out relatively quickly during use, for example, within months and there is also the danger of breakage of the measurement tip due to faulty control during placement. The entire measuring tip unit must then be exchanged and replaced.

Similar considerations hold for another known measurement tip unit in which the measuring tip is constructed in a coplanar line technology and is disclosed in U.S. Pat. No. 4,849,689, whose disclosure is incorporated by reference thereto and which was the basis for European Letters Patent 0 367 542. The actual measurement tip consists of a triangular dielectric substrate on whose back surface a coplanar line is fashioned. The substrate bearing the coplanar line is relatively sensitive to wear and breakage. During the adjustment of the measuring tip unit under a microscope, the measuring point is covered over a relative large surface by the substrate, and only the ends of the coplanar lines are visible. Therefore, adjustment is thus very difficult and imprecise.

SUMMARY OF THE INVENTION

An object of the present invention is to create a measuring tip unit that can be manufactured simply and economically, is not sensitive to damage, has a low rate of wear, is nonetheless easy to handle and can be used universally.

These objects are provided by an improvement in a measuring tip unit for contacting planar microwave circuits which unit has a housing containing a coplanar line, means for connecting a coaxial line to one end of the coplanar line and at least two contact tips extending from another end of the housing being connected to the other end of the coplanar line. The improvement includes the contact tips are formed by thin needles arranged at a spacing along side one another which form a unit that can be detached from the housing and from the coplanar line and which units extends out of the housing with the outer ends and are electrically connected to the strip conductors of the coplanar line with their inner ends.

Due to the construction of the measuring tips as needles made of elastic spring steel material, breaking off of the measuring tip is practically excluded and the needles are also substantially more durable and do not wear as fast and thus must be replaced less often. During exchange of the measuring tip, only the connection between the needles and the coplanar line must be detached and is then possible to exchange only the worn parts. Since there is a free view between the needles, and the microwave circuit is also visible during measurement, the measuring tips in the form of needles can be set very precisely under the microscope at the measurement point of the microwave circuit.

The coplanar line connected between the coaxial line terminal and the contact tips enables the simple construction of a universally employable measuring tip unit with widely varying characteristics respectively desired for specific cases of application. Thus, for example, an arbitrary input impedance can be produced between the contact tips which can be advantageous for specific measurement task via the building of an impedance transformation circuit into the coplanar line of the housing. It is even possible to integrate arbitrary passive and/or even active microwave circuits into the coplanar line in the housing and thus for example include parts of the measuring apparatus connected in the measuring tip unit.

For the transition from the coaxial line terminal to the coplanar line, standard known transitions can be used. However, plug connections for three strip conductors arranged along side one another include a cylindrical outer conductor of the coaxial line being split into two opposed gradually tapering triangular side segments bent towards one another and the cylindrical inner conductor tapering conically and being disposed between the two outer conductors to form a connection to a three conductor planar line. In another example, when only two strip conductors are provided, the inner conductor of the coaxial line tapers conically and is gradually bent laterally from its mid-axis in the direction of the outer conductor and the terminal lugs are fashioned respectively on the tapered end of the inner conductor and on the edge of the cylindrical outer conductor to form one plane. These two types of plug connectors are also suited for simple and economic construction as transition plugs from a coaxial line to a coplanar line for other applications in addition to the measuring tip unit of the present invention.

According to the invention, by "coplanar lines" microwave lines are meant, in which all strip conductors are fashioned on the same side of the substrate, thus for example a symmetrical coplanar line is three coplanar strip lines consisting of the three strip conductors arranged along side one another or, respectively, symmetrically or asymmetrically two strip lines as shown for example in FIG. 4.7/1e, 1f and 1g on page 157 of the German text by Zinke and Brunswig, *Hochfrequenztechnik* 1 , 5th edition.

Other advantages and features of the invention will be readily apparent from the following description of the preferred embodiments, the drawings and claims.

DESCRIPTION OF THE PREFERRED EMBODIMENTS

Figure 1:
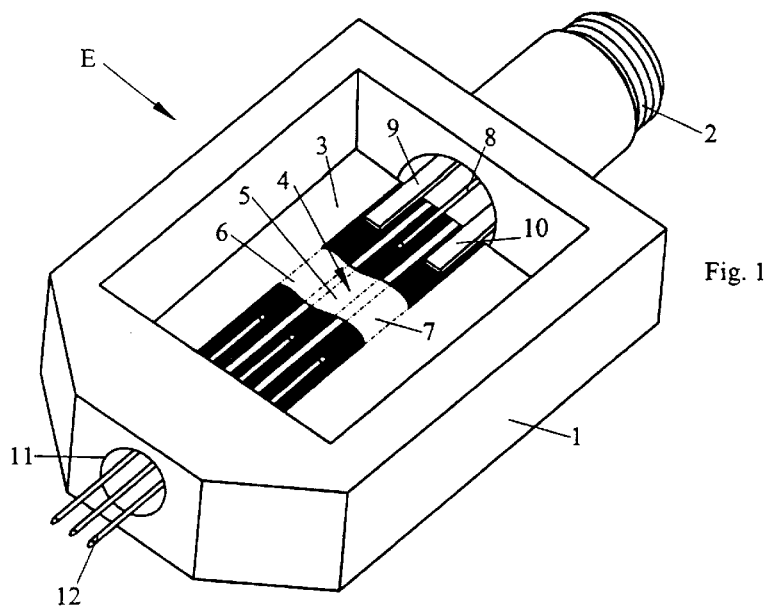
FIG. 1 is an enlarged perspective view of the inventive measuring tip unit.

The principles of the present invention are particularly useful when incorporated into measuring tip unit generally indicated at E in FIG. 1. The unit E consists of a flat metal housing 1 shown with a cover removed and of a coaxial line terminal 2 fashioned into one end surface of the housing 1 to form a coaxial plug onto which a coaxial cable leading to a measurement apparatus (not shown), for example a network analyzer, can be threaded or screwed. A microwave substrate 3 is attached to the base of the housing 1 on which a coplanar line 4 is constructed which extends from one end of the housing facing the coaxial line terminal 2 to the opposite end. In an exemplary embodiment, the coplanar line 4 is fashioned as three strip lines and consists of a metal strip conductor 5 and lateral ground strip conductors 6 and 7 which are separated therefrom by slots. The coaxial line terminal 2 goes over into the three terminal lugs 8, 9 and 10 arranged along side one another with the middle terminal lug 8 being connected to the inner conductor and the lateral terminal lugs 9 and 10 being connected to the outer conductor of the coaxial line terminal 2. These terminal lugs 8, 9, and 10 protrude inward through an opening in the end wall of the housing 1 and are applied with pressure flat onto the surface of the strip conductors 5, 6 and 7 of the coplanar line. If the contact made due to pressure is insufficient, a terminal lug can also be electrically connected with the strip conductors by means of soldering or by bonding wires.

Figure 2:
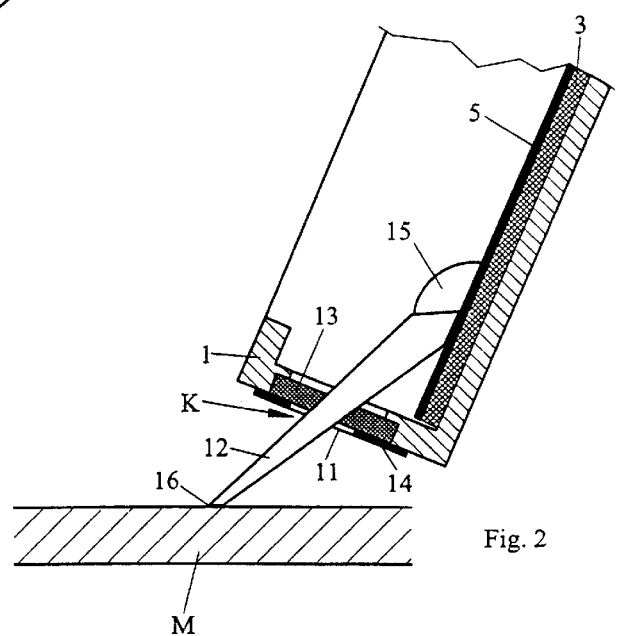
FIG. 2 is a cross-sectional view through the end of the measuring tip while making a measurement.

In an end of the housing 1 opposite the coaxial line terminal 2, an opening 11 is provided which lies opposite the coaxial plug 2 and through which three thin needles 12 arranged along side one another with a spacing protrude or extend outward from the interior of the housing. In the housing, these needles 12 are connected with the three strip conductors 5, 6 and 7 of the coplanar line 4. Details of the needle arrangement are best shown in FIG. 2. The needles are set along side one another in a body 13 made of an insulating material which is detachable fastened in the opening 11 of the housing by a mounting ring 14. The needles can have a rectangular or a round cross-section and have a slightly conical construction. A thinning outer end 16 of each needle and a thicker inner line end are each beveled in the shape of a chisel. In addition, needles 12 are set in the body 13 with the ends 16 extending on towards one another so that the tip 16 have a small spacing of only a few $\mu$m that is required for the contacting with the microwave circuit M to be measured while the ends lying in the housing have a spacing predetermined by the spacing of the strip conductors 5, 6 and 7 of the coplanar line 4. The mutual conical spacing of the needles 12 and their conical diameter is chosen while taking into account the dielectric constant of the insulating body 13 so that a predetermined impedance is attained for the respective case of applications between the tips 16 of the needles 12. The chisel-shaped beveling of the tip 16 is moreover chosen in such a way that given the placement of the measuring tip unit E at an angle, which is shown in FIG. 2, the needle ends produce a surface contact with the region to be contacted of the microwave circuit M. The inner thicker ends of the conical needles 12 are also beveled in a chisel-shape and lie with surface contact on the surface of the strip conductors 5, 6 and 7 and are again preferably held in contact therewith by pressure alone. As needed, an additional electrical connection can also be provided here in the form of bonding wires 15. The diameter of the needles of the thicker end lie for example between 0.5 and 1 mm and between 50 and 100 $\mu$m at the outer pointed end 16.

In the case of wear or damage to the needles, the contact tip unit K, which consists of the three needles 12 and the element 13 of insulating material, is simply removed from the housing opening 11 after the mounting ring 14 has been detached. The unit K is then replaced with a new contact tip unit and it is thereby possible to replace only the worn parts in a measuring tip unit E at a very low expense. The parts such as the housing, coplanar lines 4 and coaxial plug are retained and this reduces the cost of replacement or repair.

In the exemplary embodiment illustrated with a continuous coplanar line 4 between for example a 50 $\Omega$ coaxial line terminal 2 and the needles 12 which are arranged at a spacing predetermined for an input impedance of 50$\Omega$, the measuring tip unit E has an input impedance of 50 $\Omega$ and is thus suited for measurements in 50 $\Omega$ system. However, a measuring tip unit E according to FIG. 1 can also easily be modified for other input impedance between the measuring tips. For this reason, it is necessary only to build a corresponding impedance transformation circuit into the coplanar lines 5, 6 and 7. For example, in the center thereof and to choose the spacing of needles 12 corresponding to this desired impedance. In this way, input impedance in the region of a few $\Omega$ to a few k$\Omega$ can, for example, be chosen between the measuring tips while the connection to the measurement apparatus further occurs via a 50 $\Omega$ coaxial cable.

In place of the coplanar line consisting of three strip conductors 5, 6 and 7, a symmetrical or asymmetrical coplanar line could also be provided in the housing. In this case, only two needles 12 are also then provided which enables a symmetrical or, respectively, asymmetrical two-point measurement signal recording.

The construction of the contact tips as thin elastic needles made of an elastic spring steel material assures that the measurement tips can be directed very precisely under the microscope and can be placed on extremely small contact points of only 10 to 200 $\mu$m of the microwave circuit to be measured. Since the needles are flexibly, elastically deformable, the wear is also minimal and the risk of the needle breakage is also low.

Other passive and/or active circuit requirements for the operation of the measurement tip unit can also be built into the housing 1 of the measurement tip unit E if necessary. Thus, for example circuits for the direct voltage supplied via the measurement tips to the object under measurement can be provided which are connected with the externally arranged devices via lines let out laterally from the housing.

Figure 3:
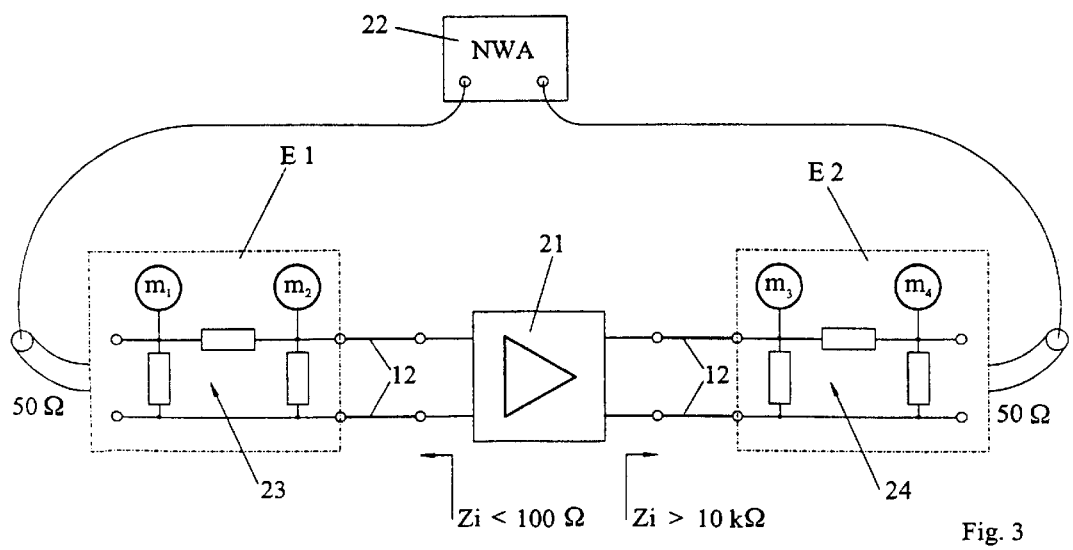
FIG. 3 is a circuit diagram of impedance transformation circuits which may be integrated into the measuring tip units.

Another possibility for the immediate integration of circuit parts of a vectorial network analyzer into the measuring tip unit in the inventive measurement tip unit E is shown in FIG. 3. Here the measurement construction for measuring a measurement object 21, for example, a voltage amplifier for high frequencies, is shown by means of a vectorial network analyzer 22.

The schematic indication measurement points m1-m4 of the network analyzer are immediately integrated in the housing 1 of the measurement tip units E1 and E2. These measurement points consist of, for example, frequency-converting components such as mixers, amplifiers, analog/digital converters and similar active and passive components which are thereby connected as closely as possible to the measurement object via the coplanar line which is advantageously in particular for measurements of the high frequency range. In a similar way, additional other units such as generators, noise sources or the like can also be integrated into the housing of the measurement tip unit which other elements are then connected immediately with the coplanar line in the vicinity of the measurement object and which are then connected with another apparatus if necessary via lines leading outward from the housing.

In addition, the measurement construction according to FIG. 3 shows by means of impedance transformation circuits in the form of resistance networks 23 and 24 which are integrated in the measurement tip units E1 and E2. The respectively most advantageous input impedance can be selected between the measurement tips of the needles 12 with which the corresponding input and output terminals of the measurement object 21 are contacted. In the embodiment shown, the spacing of the contact tips of the measurement tip unit E1 and the impedance transformation circuit 23 are dimensioned in such a way that the input impedance of less than 100 Ω prevails between the needles 12 although the measurement tip unit E1 is connected with the network analyzer 22 via a 50 Ω coaxial cable. At the output side, during measurement of the measurement object 21 a high-ohm input impedance of the measurement tip unit E2 is desired. The measurement tip of the unit E2 are thus arranged in a correspondingly greater distance from one another and the impedance transformation network 24 is dimensioned in such a way that there is an input impedance of, for example, 10 kΩ.

Figure 4:
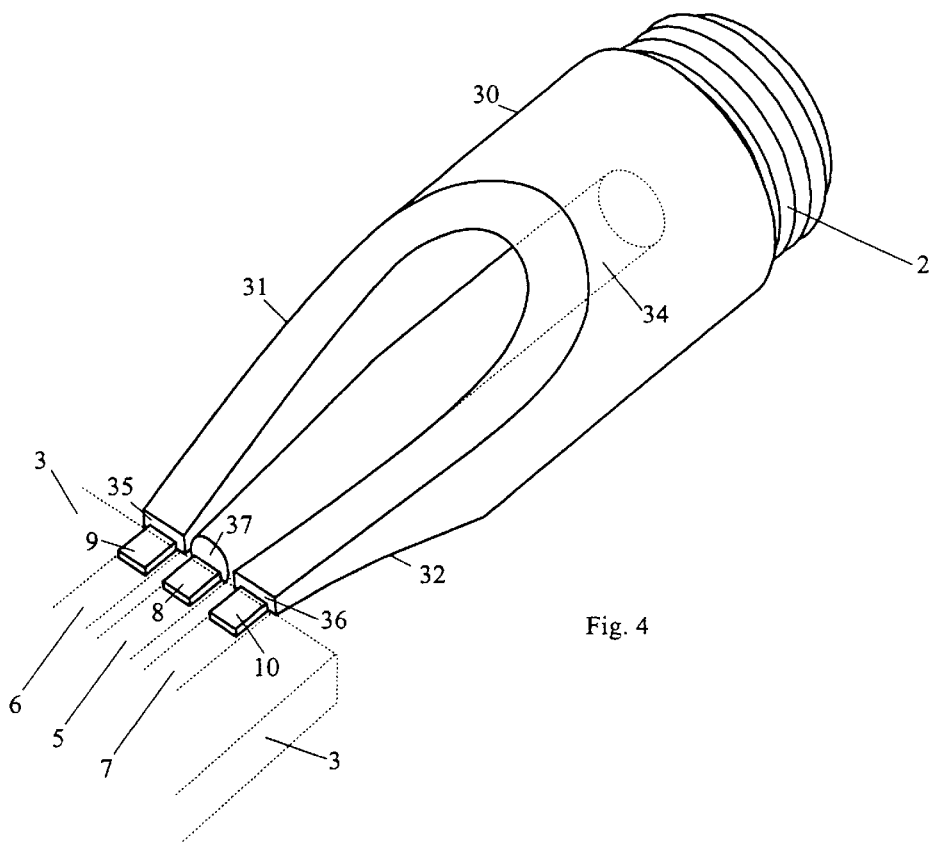
FIG. 4 is a perspective view of a transition from a coaxial line terminal to a symmetrical three strip coplanar line.

For the transition from a coaxial line terminal 2 to a coplanar line on the microwave substrate 3 which has a symmetrical three strip conductor coplanar line, a transition shown in FIG. 4 is utilized. When you have a two strip conductor coplanar line such as illustrated in FIG. 5, the transition shown in FIG. 5 is utilized.

According to the embodiment shown in FIG. 4, the outer conductor 30 of the coaxial line terminal 2 is split and runs out in two opposite gradually tapering triangular segments 31 and 32 whose ends 35 and 36 are moreover to be bent inwardly slightly towards one another. An inner conductor 34 is conically tapered. By means of this shaping of the outer and inner conductors, it is achieved that a radially symmetrical electromagnetic field at the end of the coaxial side goes over gradually into the field distribution of the coplanar line that is formed between the tapered ends 35 and 36 of the opposed external conductor segments 31 and 32 and lying in the plane therewith the tapered end 37 of the inner conductor. The ends 35 is connected by a terminal lug 9 to the strip 6 while the end 36 is connected via a lug 10 to the conductor strip 7 and the end 37 of the center conductor is connected by a lug 8 to the strip 5.

Figure 5:
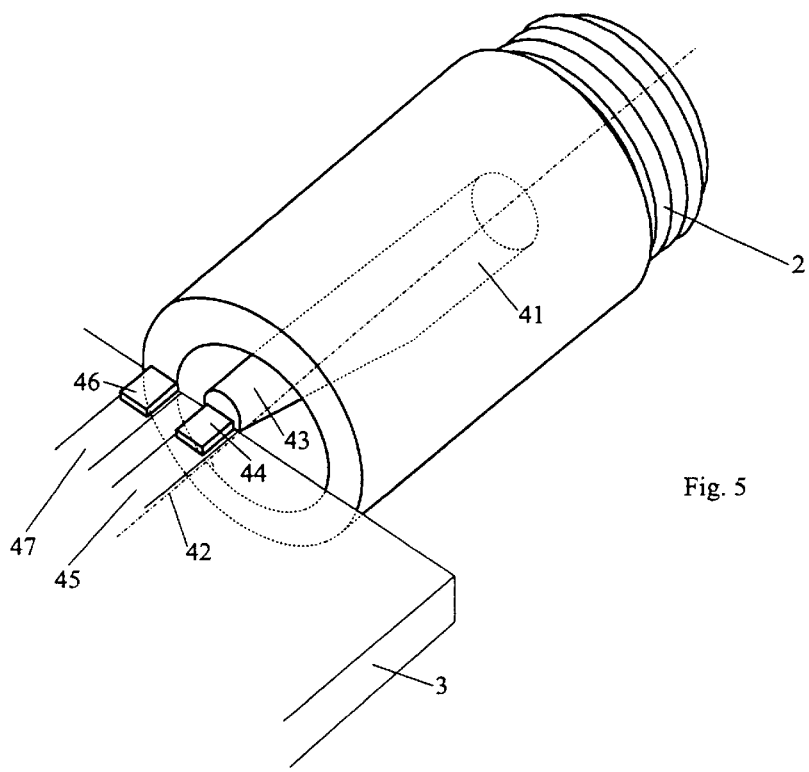
FIG. 5 is a perspective view of a transition from a coaxial line terminal to an asymmetric two strip conductor coplanar line.

In an asymmetrical transition according to FIG. 5, the inner conductor 41 is fashioned with a conical tapering inside the cylindrical outer conductor 30 and is eccentrically bent from a mid-axis 42 laterally outwardly up to a point close to the inner wall of the outer conductor 30, in such a way that here as well the radial symmetrical electrical magnetic field of the coaxial line terminal gradually goes over into an asymmetrical electromagnetic field of an asymmetrical coplanar line. The tapered end 43 of the inner conductor is connected via a terminal lug 44 with a narrow printed conductor 45 of the asymmetrical coplanar line and the outer conductor 30 is connected with the broader strip conductor 47 of the coplanar line by a terminal lug 46 arranged in the same plane as the lug 44. These transitions shown in FIGS. 4 and 5 from the coaxial line to the coplanar lines can be used not only for the inventive purpose in the measuring tip E according to FIG. 1 but are suitable in the same way for transition plugs and the like.

Although various minor modifications might be suggested by those skilled in the art, it should be understood that I wish to embody within the scope of the patent warranted hereon all such modifications as reasonably and properly come with the scope of my contribution to the art.

I claim:

1. A measuring tip unit for contacting planar microwave circuits, said unit having a housing containing a coplanar line, one end of the housing being connected to a coaxial line and the other end of the housing having at least two contact tips extending therefrom which are connected to the coplanar line, the improvements comprising the contact tips being formed by thin needles being arranged at a spacing along side one another and extending through a body of insulating material to form a unit that is detachably fastened in an opening of the housing and can be detached from the housing and from the coplanar line, said needles extending from the body and housing with their outer ends and being electrically connected with the strip conductors of the coplanar line with their inner ends.

2. A measurement tip unit according to claim 1, wherein the needles are fashioned so as to taper conically to a point and are arranged with their outer ends converging towards a point.

3. A measurement tip unit according to claim 1, wherein the needles are separated from one another outside of the housing only by air.

4. A measurement tip unit according to claim 1, wherein the inner ends of the needles are applied to the surface of the strip conductors of the coplanar line with pressure alone.

5. A measurement tip unit according to claim 1, wherein the needles are made of elastic spring steel material.

6. A measurement tip unit according to claim 1, wherein the diameter and mutual spacing of the needles arranged along side one another is chosen while taking into account the dielectric constant of the dielectric present between the needles in such a way that an impedance predetermined for the respective case of application exists between the tips of the needles.

7. A measurement tip unit according to claim 1, wherein the tips of the needles are beveled with a chisel-shape so that when the needles are placed on a planar waveguide circuit to be contacted they produce a surface contact therewith.

8. A measurement tip unit according to claim 1, wherein the coplanar line is constructed as a symmetrical three strip conductor and the contact tip unit consists of three contacting needles.

9. A measurement tip unit according to claim 1, wherein the coplanar line is constructed as a symmetrical two strip conductor and the contact unit consists of two contact needles.

10. A measurement tip unit according to claim 1, wherein the coplanar line is constructed as an asymmetrical coplanar line and the contact tip unit consisting of two contacting needles.

11. A measurement tip unit according to claim 1, which includes additional circuits selected from passive circuits and active circuits connected with the coplanar line on the substrate.

12. A measurement tip unit according to claim 11 wherein an impedance transformation circuit is arranged in the coplanar line.

13. A measurement tip unit according to claim 1, for use with a vectorial network analyzer, which includes part of the operating circuit for the network analyzer being constructed immediately on the substrate of the tip unit.

14. A measurement tip unit according to claim 1, which includes a coaxial line terminal for transition from a coaxial line to a coplanar line which consist of three conductors arranged along side one another, said coaxial line terminal having a cylindrical outer conductor and a cylindrical inner conductor, said cylindrical outer conductor being split and extending into two opposed gradually tapering triangular side segments bent towards one another, and the cylindrical inner conductor tapering conically, and tapered ends of the outer conductor side segments and the inner conductor being arranged in one plane along side one another in a manner of a three conductor planar line.

15. A measurement tip unit according to claim 14, wherein each of the tapering ends has a terminal lug lying in one plane for connection to the coplanar lines.

16. A measurement tip unit according to claim 1, wherein the coplanar line comprises two strip conductors arranged along side one another and which includes a coaxial line terminal for transition from the coaxial line to one of the two strip conductors, said coaxial line terminal having an outer cylindrical conductor surrounding an inner conductor, said inner conductor of the line tapering conically and being gradually bent from a mid-axis in the direction of the cylindrical outer conductor, a terminal lug being constructed on a tapered end of the inner conductor and a terminal lug on an edge of the cylindrical outer conductor to be in one plane with the lug of the inner conductor.

* * * * *